United States Patent
Chae et al.

(10) Patent No.: US 7,112,842 B2
(45) Date of Patent: Sep. 26, 2006

(54) NONVOLATILE MEMORY DEVICE AND METHOD OF MANUFACTURING THE SAME

(75) Inventors: Hee-soon Chae, Gyeonggi-do (KR); Chung-woo Kim, Gyeonggi-do (KR); Kwang-youl Seo, Seoul (KR); Tae-hyun Han, Gyeonggi-do (KR); Byung-chul Kim, Gyeongsangnam-do (KR); Joo-yeon Kim, Ulsan-si (KR)

(73) Assignees: Samsung Electronics Co., Ltd., Suwon-Si (KR); Kwang-Youl Seo, Jungnang-Gu (KR)

( * ) Notice: Subject to any disclaimer, the term of this patent is extended or adjusted under 35 U.S.C. 154(b) by 0 days.

(21) Appl. No.: 10/975,996

(22) Filed: Oct. 29, 2004

(65) Prior Publication Data
US 2005/0162958 A1  Jul. 28, 2005

(30) Foreign Application Priority Data
Oct. 29, 2003  (KR) ...................... 10-2003-0075781

(51) Int. Cl.
*H01L 29/788* (2006.01)
*H01L 21/338* (2006.01)
(52) U.S. Cl. ...................... 257/321; 438/261
(58) Field of Classification Search ................ 438/216, 438/287, 261–267; 257/314–317, 321, 324
See application file for complete search history.

(56) References Cited

U.S. PATENT DOCUMENTS

| | | | | |
|---|---|---|---|---|
| 6,413,819 B1 * | 7/2002 | Zafar et al. | .................. | 438/257 |
| 6,870,765 B1 * | 3/2005 | Fujiwara | ................ | 365/185.02 |
| 6,927,136 B1 * | 8/2005 | Lung et al. | .................. | 438/288 |

* cited by examiner

*Primary Examiner*—Andy Huynh
*Assistant Examiner*—Calvin Lee
(74) *Attorney, Agent, or Firm*—Buchanan Ingersoll & Rooney PC

(57) ABSTRACT

Provided are a nonvolatile memory device and a method of manufacturing the same. The device includes a semiconductor substrate; a source region and a drain region disposed in the semiconductor substrate and a channel region interposed between the source and drain regions; a first tunnel oxide layer disposed on the channel region near the source region; a second tunnel oxide layer disposed on the channel region near the drain region; a first charge trapping layer disposed on the first tunnel oxide layer; a second charge trapping layer disposed on the second tunnel oxide layer; a blocking oxide layer covering the first and second charge trapping layers; a charge isolation layer interposed between the first and second charge trapping layers; and a gate electrode disposed on the blocking oxide layer.

8 Claims, 10 Drawing Sheets

NONVOLATILE MEMORY DEVICE AND METHOD OF MANUFACTURING THE SAME

This application claims the priority of Korean Patent Application No. 2003-75781, filed on Oct. 29, 2003, in the Korean Intellectual Property Office, the disclosure of which is incorporated herein in its entirety by reference.

BACKGROUND OF THE INVENTION

1. Field of the Invention

The present invention relates to a semiconductor device and a method of manufacturing the same, and more particularly, to a nonvolatile memory device and a method of manufacturing the same.

2. Description of the Related Art

A nonvolatile semiconductor memory (NVSM) is categorized into a floating gate type or a metal insulator semiconductor (MIS) type in which two or more kinds of dielectric layers are stacked.

A floating type NVSM functions as a memory using potential wells, and an erasable programmable read only memory (EPROM) tunnel oxide (ETOX) structure is being widely used as a flash electrically erasable and programmable read only memory (flash EEPROM).

An MIS type NVSM functions as a memory using trap sites that exist between a dielectric layer and a bulk or between dielectric layers. Typically, the MIS type NVSM can be classified into a metal-oxide-nitride-oxide-silicon (MONOS) type, a silicon-oxide-nitride-oxide-silicon (SONOS) type, and the likes.

FIG. 1 is a cross-sectional view of a conventional NVSM having a MONOS or SONOS type structure.

Referring to FIG. 1, a source region 16S and a drain region 16D are disposed in a semiconductor substrate 11 and separated apart from each other. A tunnel oxide layer 12, a charge trapping layer 13, a blocking oxide layer 14, and a gate electrode 15 are sequentially stacked on a channel region 17 interposed between the source and drain regions 16S and 16D. Insulating spacers 18 are formed on the sidewalls of the stacked structure. The tunnel oxide layer 12 is formed of thermal oxide, the charge trapping layer 13 is formed of silicon nitride, and the blocking oxide layer 14 is formed of oxide using wet oxidation or chemical vapor deposition (CVD). In the case of the MONOS type, the gate electrode 15 is formed of a metal. In the case of the SONOS type, the gate electrode 15 is formed of doped polysilicon.

The programming and erasing of the conventional NVSM will be described now.

At the outset, during programming, if a sufficiently high positive (+) voltage is applied to the gate electrode 15, electrons emitted from the semiconductor substrate 11 tunnel the tunnel oxide layer 12 and are injected into the charge trapping layer 13. In this case, the blocking oxide layer 14 disposed on the charge trapping layer 13 prevents the electrons injected in the charge trapping layer 14 from leaking into the gate electrode 15 and also prevents injection of holes from the gate electrode 15 into the charge trapping layer 13. The electrons, which are injected into the charge trapping layer 13 through the tunnel oxide layer 12, are trapped in a bulk trap of the charge trapping layer 13 or in an interfacial trap between the charge trapping layer 13 and the blocking oxide layer 14, and a threshold voltage increases.

During erasing, by applying a negative (−) voltage to the gate electrode 15, the trapped electrons are emitted to the semiconductor substrate 11 so that a threshold voltage is reduced to the same value as before programming.

In recent years, with the developments in nanotechnologies, much research into the use of an NVSM and a 2-bit-per-cell NVSM using nano-crystals has been conducted.

FIG. 2 is a cross-sectional view of a conventional NVSM using nano-crystals.

Referring to FIG. 2, a source region 26S and a drain region 26D are disposed in a semiconductor substrate 21 and separated apart from each other. A tunnel oxide layer 22, a charge trapping layer 23, a blocking oxide layer 24, and a gate electrode 25 are sequentially stacked on a channel region 27 interposed between the source and drain regions 26S and 26D. Insulating spacers 28 are disposed on the sidewalls of the stacked structure. The charge trapping layer 23 is formed of clusters or dots having a size of several to several tens of nm, namely, nano-crystals 23NC.

A method of manufacturing the charge trapping layer 23 formed of the nano-crystals 23NC is disclosed in the following two papers.

(I) "A Silicon Nanocrystals Based Memory by Sandip Tiwari et al., Appl. Phys. Lett. 68(10) p. 1377(1996)": A tunnel oxide layer having a thickness of 1.1 to 1.8 nm is formed on a semiconductor substrate in which source and drain regions are disposed. Nanocrystals having a diameter of 5 nm, which constitute a charge trapping layer, are formed on the tunnel oxide layer by a space of 5 nm using a CVD apparatus. The density of the nanocrystals is about $1 \times 10^{12}/\text{cm}^{-2}$. A 7-nm blocking oxide layer is formed on the charge trapping layer, and a gate electrode is formed on the blocking oxide layer.

(II) "Fast and Long Retention-Time nano-Crystal Memory by Hussein I. Hanafi et al., IEEE Trans. Electron Device, Vol. 43, p. 1553(1996)": A 5 to 20-nm oxide layer is formed on a semiconductor substrate. A high concentration of Si or Ge ions are implanted into the oxide layer and supersaturated. In this case, the ions are implanted with about 5 KeV and a dose of about $5 \times 10^{15}$ ions/cm². The doped oxide layer is annealed in an $N_2$ atmosphere at 950° C. for 30 minutes, thereby growing Si or Ge nano-crystals in the oxide layer to a diameter of 5 nm. A source region and a drain region are formed in the semiconductor substrate and separated a predetermined distance apart from each other, and a gate electrode is formed on a portion of the oxide layer corresponding to a channel region interposed between the source and drain regions.

The conventional NVSMs using nano-crystals have the advantages of the foregoing conventional MONOS or SONOS type NVSMs. Also, charges, which are injected into nano-crystals of a charge trapping layer, cannot easily move between the nano-crystals. Accordingly, in comparison with the conventional MONOS or SONOS type NVSMs, NVSMs using nano-crystals can suppress lateral diffusion of charges, be effectively embodied as 2-bit-per-cell NVSMs, and be easily downscaled.

However, when a conventional NVSM using nano-crystals is embodied as a 2-bit-per-cell memory, it is very difficult to scale down the NVSM to a nanoscale or terascale ultrahigh-integrated device. For example, to manufacture a 2-bit-per-cell device, charges are partially injected into charge trapping layers adjacent to source and drain regions. In the case of a short channel, both a superposition effect and a lateral diffusion of charges occur during the injection of the charges, thus disturbing 2-bit-per-cell operations of the NVSM. To solve this problem, channel length should be maintained above a predetermined value. In this case, it is impossible to further scale down NVSMs and further increase the integration density thereof. Accordingly, the foregoing conventional NVSMs using nano-crystals cannot meet the requisitions of the next-generation semiconductor technologies, such as low voltage, subminiature size, ultra-high integration, high performance, and high reliability.

SUMMARY OF THE INVENTION

The present invention provides a nonvolatile semiconductor memory device (NVSM), which meets the requisitions of the next-generation semiconductor technologies, such as low voltage, subminiature size, ultrahigh integration, high performance, and high reliability, writes at least two bits per cell, and can be downscaled to a nanoscale size or less.

Also, the present invention provides a method of manufacturing the above-described NVSM.

According to an aspect of the present invention, there is provided an NVSM comprising a semiconductor substrate; a source region and a drain region disposed in the semiconductor substrate and a channel region interposed between the source and drain regions; a first tunnel oxide layer disposed on the channel region near the source region; a second tunnel oxide layer disposed on the channel region near the drain region; a first charge trapping layer disposed on the first tunnel oxide layer; a second charge trapping layer disposed on the second tunnel oxide layer; a blocking oxide layer covering the first and second charge trapping layers; a charge isolation layer interposed between the first and second charge trapping layers; and a gate electrode disposed on the blocking oxide layer.

Each of the first and second tunnel oxide layers may be about 1 to 5 nm thick.

Each of the first and second charge trapping layers may be about 15 to 100 nm in length.

Each of the first and second charge trapping layers may include a plurality of nano-crystals having the form of clusters or dots.

The first and second charge trapping layers may be formed of at least one selected from the group consisting of tungsten, molybdenum, cobalt, nickel, platinum, rhodium, palladium, and iridium, or a mixture or alloy thereof.

The first and second charge trapping layers may be formed of one selected from the group consisting of silicon, germanium, a mixture of silicon and germanium, III–V group compounds, and II–VI group compounds.

The charge isolation layer may be about 10 to 100 nm in length, and the blocking oxide layer may be about 3 to 150 nm thick.

According to another aspect of the present invention, there is provided a method of manufacturing an NVSM. The method includes forming an oxide layer on a semiconductor substrate, wherein the semiconductor substrate is divided into a source section, a gate section, and a drain section, and the gate section includes a first charge trapping section, a charge isolation section, and a second charge trapping section; implanting impurity ions into a portion of the oxide layer formed in the first and second charge trapping sections separated by the charge isolation section; forming a plurality of nano-crystals in the portion of the oxide layer formed in the first and second charge trapping sections by crystallizing the implanted impurity ions using crystallization annealing; and depositing a gate electrode material on the portion of the oxide layer in which the nano-crystals are embedded and removing the gate electrode material and the oxide layer except in the gate section using a gate etching process.

According to yet another aspect of the present invention, there is provided a method of manufacturing an NVSM. The method includes forming a first oxide layer on a semiconductor substrate, wherein the semiconductor substrate is divided into a source section, a gate section, and a drain section, and the gate section includes a first charge trapping section, a charge isolation section, and a second charge trapping section; implanting impurity ions into the first oxide layer; forming a plurality of nano-crystals in the first oxide layer by crystallizing the implanted impurity ions using crystallization annealing; forming an etch preventing pattern and etch preventing spacers on a portion of the first oxide layer in which the nano-crystals are embedded, such that the a portion of first oxide layer formed in the charge isolation section is exposed; forming a hole in the first oxide layer by etching the first oxide layer using the etch preventing pattern and the etch preventing spacers as an etch mask, such that the hole separates the portion of the first oxide layer in which the nano-crystals are embedded from the remaining portion thereof; removing the etch preventing pattern and the etch preventing spacers and forming a second oxide layer such that the hole is filled with the second oxide layer; and depositing a gate electrode material on the portion of the first oxide layer in which the nano-crystals are embedded and the second oxide layer and etching the gate electrode material and the first oxide layer except in the gate section using a gate etching process.

According to further another aspect of the present invention, there is a method of manufacturing an NVSM. The method includes forming a first oxide layer on a semiconductor substrate, wherein the semiconductor substrate is divided into a source section, a gate section, and a drain section, and the gate section includes a first charge trapping section, a charge isolation section, and a second charge trapping section; forming a plurality of nano-crystals on the first oxide layer; forming a second oxide layer on the first oxide layer on which the nano-crystals are formed; forming an etch preventing pattern and etch preventing spacers on a portion of the second oxide layer in which the nano-crystals are embedded, such that a portion of the second oxide layer formed in the charge isolation region is exposed; forming a hole in the first and second oxide layers by etching the first and second oxide layers using the etch preventing pattern and the etch preventing spacers as an etch mask, such that the hole separates the portion of the second oxide layer in which the nano-crystals are embedded from the remaining portion thereof; removing the etch preventing pattern and the etch preventing spacers and forming a third oxide layer such that the hole is filled with the third oxide layer; and depositing a gate electrode material on the portion of the second oxide layer in which the nano-crystals are embedded and the third oxide layer and removing the gate electrode material and the first and second oxide layers except in the gate section using a gate etching process.

According to still further another aspect of the present invention, there is provided a method of manufacturing an NVSM. The method includes sequentially forming a first oxide layer and a polysilicon layer on a semiconductor substrate, wherein the semiconductor substrate is divided into a source section, a gate section, and a drain section, and the gate section includes a first charge trapping section, a charge isolation section, and a second charge trapping section; forming an oxidation preventing pattern and an oxidation preventing spacers on the polysilicon layer such that a portion of the polysilicon layer formed in the charge isolation region is exposed; forming a second oxide layer on the exposed portion of the polysilicon layer by performing an oxidation process using the oxidation preventing pattern and the oxidation preventing spacers; removing the oxidation preventing pattern and the oxidation preventing spacers and forming a polysilicon pattern by etching the polysilicon layer using the second oxide layer as an etch mask; implanting impurity ions into the first oxide layer using the polysilicon pattern as a mask; forming a plurality of nano-crystals by crystallizing the implanted ions using crystallization annealing; forming polysilicon layer spacers on the both sidewalls of the polysilicon pattern and completing a gate electrode comprised of the polysilicon pattern and the polysilicon layer spacers; and removing the second oxide layer and an exposed portion of the first oxide layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
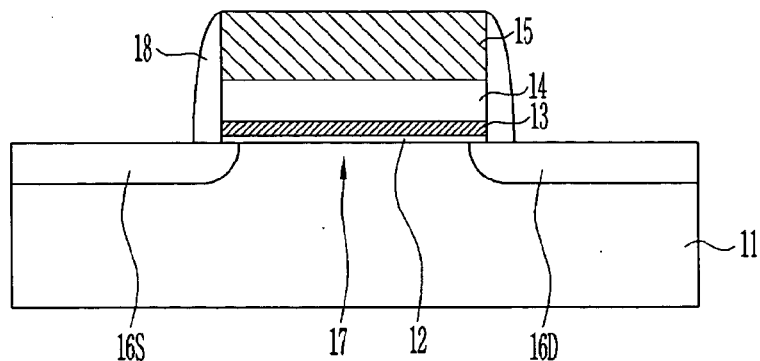
FIG. 1 is a cross-sectional view of a conventional nonvolatile semiconductor memory device (NVSM) having a MONOS or SONOS structure.
Figure 2:
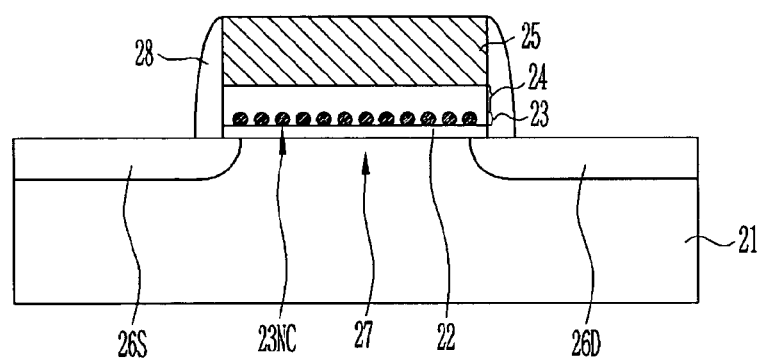
FIG. 2 is a cross-sectional view of a conventional NVSM using nano-crystals.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. The same reference numerals are used to denote the same elements in the drawings.

Figure 3:
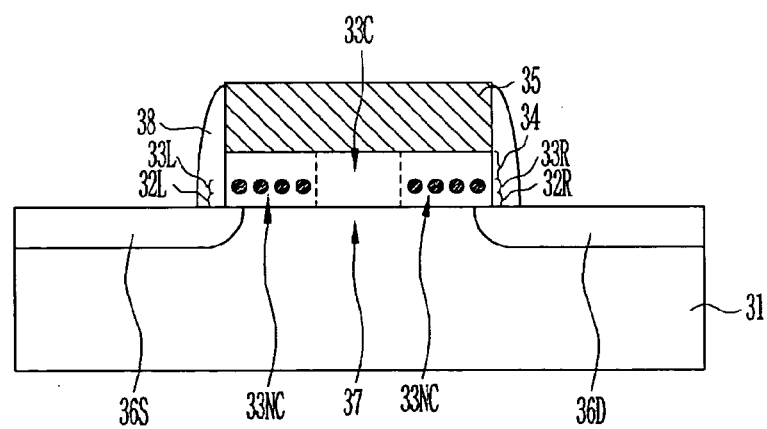
FIG. 3 is a cross-sectional view of an NVSM according to the present invention.

FIG. 3 is a cross-sectional view of a nonvolatile semiconductor memory device (NSVM) writing two bits per cell according to the present invention.

Referring to FIG. 3, a semiconductor substrate 31, in which an active region is defined by forming an isolation layer (not shown), is provided. A source region 36S and a drain region 36D, between which a channel region 37 is interposed, are disposed in the semiconductor substrate 31 and separated apart from each other. A first tunnel oxide layer 32L is disposed on the channel region 37 near the source region 36S, and a second tunnel oxide layer 32R is disposed on the channel region 37 near the drain region 36D. The first and second tunnel oxide layers 32L and 32R are separated from each other by a charge isolation layer 33C. A first charge trapping layer 33L is disposed on the first tunnel oxide layer 32L, and a second charge trapping layer 33R is disposed on the second tunnel oxide layer 32R. The first and second charge trapping layer 33L and 33R are separated from each other by the charge isolation layer 33C. A blocking oxide layer 34 covers the first and second charge trapping layers 33L and 33R. A gate electrode 35 is disposed on the blocking oxide layer 34. Insulating spacers 38 are formed on the sidewalls of the above-described stacked structure including the gate electrode 35.

Meanwhile, each of the first and second charge trapping layers 33L and 33R includes a plurality of nano-crystals 33NC. The nano-crystals 33NC look to be stuck in a lower end portion of the blocking oxide layer 34.

A distance between the source and drain regions 36S and 36D is several tens to several hundreds of nm. Thus, the channel region 37 scales several tens to several hundreds of nm. The first and second tunnel oxide layers 32L and 32R each have a thickness of several nm, for example, about 1 to 5 nm, and the lengths thereof depend on the lengths of the first and second charge trapping layers 33L and 33R, respectively. The first and second tunnel oxide layers 32L and 32R each may have a larger thickness than described above, but are preferably as thin as possible to achieve successful erasing, low programming voltage, and rapid programming unless other problems are generated.

Each of the first and second charge trapping layers 33L and 33R includes the plurality of nano-crystals 33NC, which look like clusters or dots having a size of several to several tens of nm, for example, about 1 to 15 nm. Each of the nano-crystals 33NC operates independently by 1 bit, has a length of about 15 to 100 nm, and is formed of a semiconductor or a metal. A space between the nano-crystals 33NC may be several to several tens of nm, for example, about 1 to 10 nm, but preferably 5 to 10 nm to prevent disturbance caused by lateral diffusion of charges.

Normally, if a space between nano-crystals is less than 5 nm, lateral diffusion occurs between charges injected into a charge trapping layer near a source region and charges injected into a charge trapping layer near a drain region, thereby disturbing 2-bit-per-cell operations.

However, the NVSM of the present invention includes the first and second charge trapping layers 33L and 33R, which are isolated by the charge isolation layer 33C. Thus, even if a space between the nano-crystals 33NC is less than 5 nm, 2-bit-per-cell operations are not disturbed.

The first and second charge trapping layers 33L and 33R may be formed of at least one selected from the group consisting of tungsten, molybdenum, cobalt, nickel, platinum, rhodium, palladium, and iridium. Also, the first and second charge trapping layers 33L and 33R may be formed of a mixture or an alloy containing at least one selected from the group consisting of tungsten, molybdenum, cobalt, nickel, platinum, rhodium, palladium, and iridium. Also, the first and second charge trapping layers 33L and 33R may be formed of a semiconductor selected from the group consisting of silicon, germanium, a mixture of silicon and germanium, III–V group compounds (combinations of III group elements such as Al, Ga, and In and V group elements such as P, As, and Sb), and II–VI group compounds (combinations of II group elements such as Zn, Cd, and Hg and VI group elements such as O, S, Se, and Te).

The charge isolation layer 33C corresponds to a region disposed on the channel region 37, where the nano-crystals 33NC are not formed. The charge isolation layer 33C is formed of the same material as the first and second tunnel oxide layers 32L and 32R and the blocking oxide layer 34. To prevent the lateral diffusion of charges between the first and second trapping layers 33L and 33R, the length of the charge trapping layer 33C may be 5 nm or more. However, to enhance reliability, the length of the charge isolation layer 33C is preferably at least 10 nm, for example, about 10 to 100 nm. The blocking oxide layer 34 prevents electrons injected in the first and second charge trapping layers 33L and 33R from leaking in the gate electrode 35 and also prevents injection of holes from the gate electrode 35 into the charge trapping layers 33L and 33R. Accordingly, the blocking oxide layer 34 may be at least thicker than the first and second tunnel oxide layers 32L and 32R. Therefore, the blocking oxide layer 34 may be, for example, 3 to 150 nm thick, but is preferably 6 to 70 nm thick to facilitate the function of the blocking oxide layer 34 and the downscaling of the NVSM.

In the meantime, all the foregoing or the following ranges of numerical values include not only those being applied to conventional devices but also those that cannot be applied to the conventional devices due to some problems caused by the downscaling of devices. In the present invention, since the first and second charge isolation layers 33L and 33R are isolated by the charge isolation layer 33C, the problems of the conventional NVSM using nano-crystals can be solved. Therefore, an NVSM, which meets low voltage, subminiature size, ultrahigh integration, high performance, and high reliability, can be obtained.

The gate electrode 35 may be formed of any conductive material for a typical gate electrode, for example, polysilicon, a metal, or a polycide including metal-silicide formed on polysilicon. As the linewidth of the gate electrode 35 becomes smaller owing to the high integration of semiconductor devices, the gate electrode 35 may be formed of a highly conductive metal or a polycide rather than polysilicon in order to suppress an increase in resistance.

The conditions under which the foregoing NVSM of the present invention operates are basically the same as or similar to those under which conventional NVSMs having a MONOS or SONOS structure or conventional NVSMs using nano-crystals operate. Therefore, the conditions under which the NVSM of the present invention operate will not be presented here.

Hereinafter, a method of manufacturing the foregoing NVSM according to the present invention will be described.

FIGS. 4A through 4E are cross-sectional views illustrating a method of manufacturing the NVSM shown in FIG. 3 according to a first embodiment of the present invention.

Figure 4A:
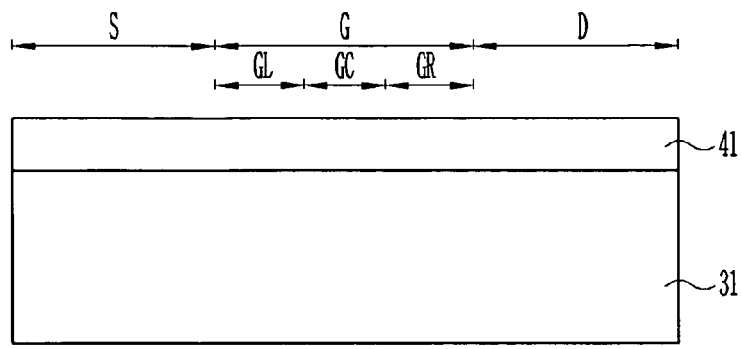
FIGS. 4A through 4E are cross-sectional views illustrating a method of manufacturing the NVSM shown in FIG. 3 according to a first embodiment of the present invention.

Referring to FIG. 4A, an isolation layer (not shown) is formed in a semiconductor substrate 31 using a typical isolation technique, thereby defining an active region. The active region of the semiconductor substrate 31 is divided into a section where a source region will be formed (hereinafter, a source section S), a section where a gate will be formed (hereinafter, a gate section G), and a section where a drain region will be formed (hereinafter, a drain section D) according to design rules. The gate section G includes a section where a first charge trapping layer will be formed (hereinafter, a first charge trapping section GL), a section where a charge isolation layer will be formed (hereinafter, a charge isolation section GC), and a section where a second charge trapping layer will be formed (hereinafter, a second charge trapping section GR). The first charge trapping section GL is connected to the source section S, the second charge trapping section GR is connected to the drain section D, and the charge isolation section GC is interposed between the first and second charge trapping sections GL and GR. An oxide layer 41 is formed on the semiconductor substrate 31. The oxide layer 41 is formed to a thickness equivalent to the sum of the thickness of a tunnel oxide layer, the size of nano-crystals forming a charge trapping layer, and the thickness of a blocking oxide layer, which will be defined later. Thus, the oxide layer 41 is formed to a thickness of about 5 to 170 nm using an ordinary oxidation process. The range of about 5 to 170 nm is obtained from a minimum and a maximum of the sum of thicknesses of the respective elements as described with reference to FIG. 3.

Figure 4B:
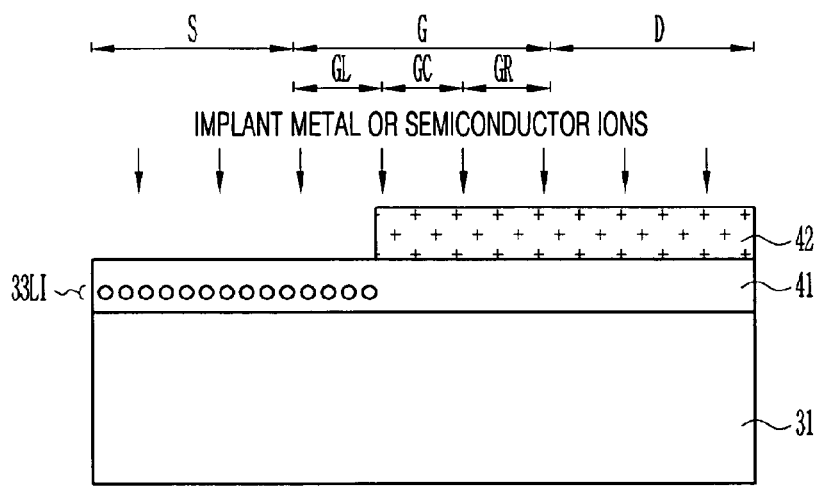

Referring to FIG. 4B, a first photoresist pattern 42 is formed on the oxide layer 41 while exposing the first charge trapping section GL and at least a portion of the source section S. A first ion implantation process is performed using the first photoresist pattern 42 as an ion implantation mask, thereby implanting metal ions or semiconductor ions into the oxide layer 41. As a result, a first ion implantation region 33LI is formed in the oxide layer 41.

The first ion implantation region 33LI is an important element that determines the thickness of a tunnel oxide layer that will be defined later. Thus, since the first ion implantation process is performed at an appropriate energy considering that the thickness of the first tunnel oxide layer 32L shown in FIG. 3 is 1 to 5 nm, the first ion implantation region 33LI can be formed about 1 to 5 nm apart from the semiconductor substrate 31.

Figure 4C:
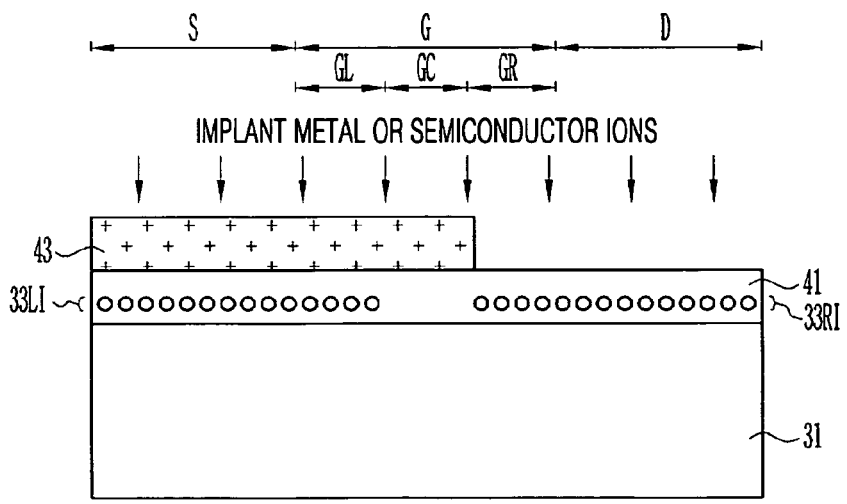

Referring to FIG. 4C, the first photoresist pattern 42 is removed. A second photoresist pattern 43 is formed on the oxide layer 41 while exposing the second charge trapping section GR and at least a portion of the drain section D. A second ion implantation process is implemented using the second photoresist pattern 43 as an ion implantation mask, thereby implanting metal ions or semiconductor ions into the oxide layer 41. As a result, a second ion implantation region 33RI is formed in the oxide layer 41. When the first and second ion implantation processes using the first and second photoresist patterns 42 and 43 are finished, a portion of the oxide layer 41 formed in the charge isolation section GC is not doped with ions.

The second ion implantation region 33RI is formed under the same conditions under which the first ion implantation region 33LI is formed, except for positions. That is, the second ion implantation process is performed in the same manner as the first ion implantation process.

Figure 4D:
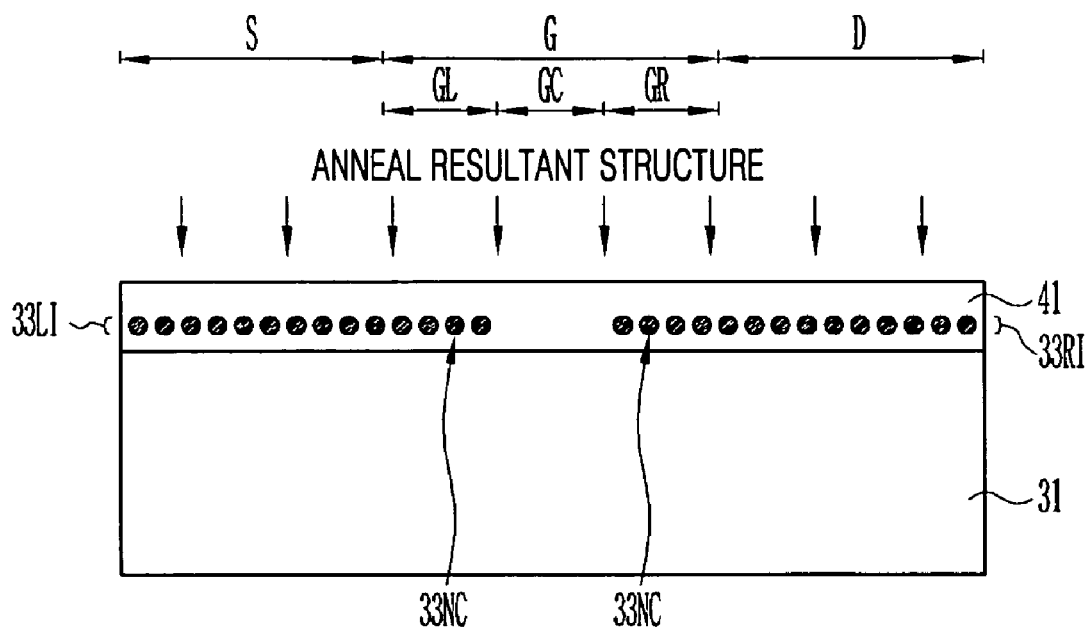

Referring to FIG. 4D, the second photoresist pattern 43 is removed, and the resultant structure from which the second photoresist pattern 43 is removed is annealed using crystallization annealing. As a result, the metal or semiconductor ions existing in the first and second ion implantation regions 33LI and 33RI are crystallized so that a plurality of nano-crystals 33NC are formed in the first and second ion implantation regions 33LI and 33RI.

If the nano-crystals 33NC are formed of Si or Ge, the crystallization annealing is performed in an $N_2$ atmosphere at 950° C. for 30 minutes. If the nano-crystals 33NC are formed of other semiconductor or metal than Si or Ge, the crystallization annealing is performed under conditions of gaseous atmosphere, temperature, and time appropriate for the material. The nano-crystals 33NC have the form of clusters or dots having a size of several to several tens of nm, for example, about 1 to 15 nm. Also, a space between the nano-crystals 33NC is several to several tens of nm, for example, about 1 to 10 nm, preferably, about 5 to 10 nm. The size and space of the nano-crystals 33NC can be adjusted by controlling the conditions of the first and second ion implantation processes or the crystallization annealing.

Figure 4E:
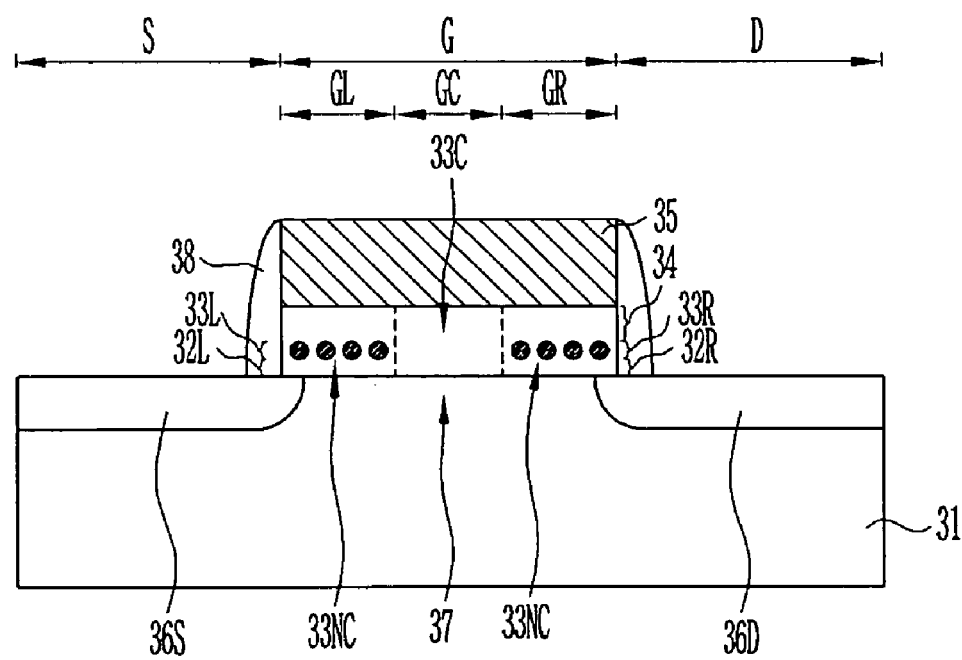

Thereafter, a gate electrode material (not shown) is deposited on the oxide layer 41 in which the nano-crystals 33NC are embedded. Next, the gate electrode material and the oxide layer 41 are etched using a gate mask (not shown) covering the gate section G as an etch mask until the semiconductor substrate 31 is exposed. Then, the gate mask is removed. As a result, a gate electrode 35 is formed on a blocking oxide layer 34 and a charge isolation layer 33C, as shown in FIG. 4E. Thereafter, conductive impurity ions are implanted into the source and drain sections S and D, thereby forming a source region 36S and a drain region 36D. Thus, the NVSM shown in FIG. 3 is completed.

In the first embodiment, the first and second tunnel oxide layers 32L and 32R are divided from the blocking oxide layer 34 by the nano-crystals 33NC embedded in the oxide layer 41. Thus, each of the first and second tunnel oxide layers 32L and 32R is about 1 to 5 nm thick, and the blocking oxide layer 34 is about 3 to 150 nm thick. The first charge trapping layer 33L includes nano-crystals 33NC embedded in a portion of the oxide layer 41 formed in the first charge trapping section GL, while the second charge trapping layer 33R includes nano-crystals embedded in a portion of the oxide layer 41 formed in the second charge trapping section GR. As a result of the gate etching process, each of the first and second charge trapping layers 33L and 33R becomes about 15 to 100 nm thick. The charge isolation layer 33C corresponds to a region of the oxide layer 41 where no nano-crystals 33NC exist, and has a length of 10 to 100 nm. A distance between the source and drain regions 36S and 36D disposed on both sides of the gate electrode 35 is several tens to several hundreds of nm and thus, the channel region 37 also scales several tens to several hundreds of nm.

FIGS. 5A through 5F are cross-sectional views illustrating a method of manufacturing the NVSM shown in FIG. 3 according to a second embodiment of the present invention.

Figure 5A:
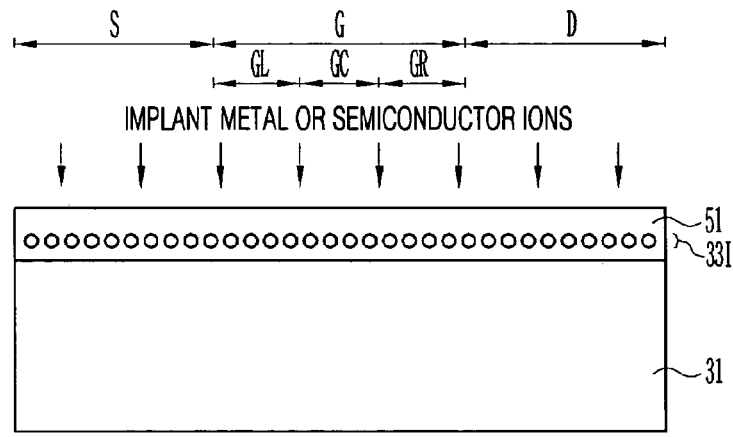
FIGS. 5A through 5F are cross-sectional views illustrating a method of manufacturing the NVSM shown in FIG. 3 according to a second embodiment of the present invention.

Referring to FIG. 5A, an isolation layer (not shown) is formed in a semiconductor substrate 31 using an ordinary isolation technique, thereby defining an active region. The active region of the semiconductor substrate 31 is divided into a source section S, a gate section G, and a drain section D according to design rules. The gate section G includes a first charge trapping section GL, a charge isolation section GC, and a second charge trapping section GR. The first charge trapping section GL is connected to the source section S, and the second charge trapping section GR is connected to the drain section D. The charge isolation section GC is interposed between the first and second charge trapping sections GL and GR. A first oxide layer 51 is formed on the semiconductor substrate 31. The first oxide layer 51 is preferably formed to a thickness equivalent to the sum of the thickness of a tunnel oxide layer, the size of nano-crystals forming a charge trapping layer, and the thickness of a blocking oxide layer, which will be defined later, but may be formed thicker or thinner than a desired thickness because the thickness of the first oxide layer 51 can be controlled during subsequent processes. Thus, the first oxide layer 51 is formed using an ordinary oxidation process to a thickness of about 5 to 170 nm or thinner or thicker. The range of about 5 to 170 nm is obtained from a minimum and a maximum of the sum of thicknesses of the respective elements as described with reference to FIG. 3. Then, metal ions or semiconductor ions are implanted into the first oxide layer 51, thereby forming an ion implantation region 33I.

The ion implantation region 33I is an important element that determines the thickness of a tunnel oxide layer that will be defined later. Thus, since the ion implantation process is performed at an appropriate energy considering that each of the first and second tunnel oxide layers 32L and 32R shown in FIG. 3 is 1 to 5 nm thick, the ion implantation region 33I can be formed about 1 to 5 nm apart from the semiconductor substrate 31.

Figure 5B:
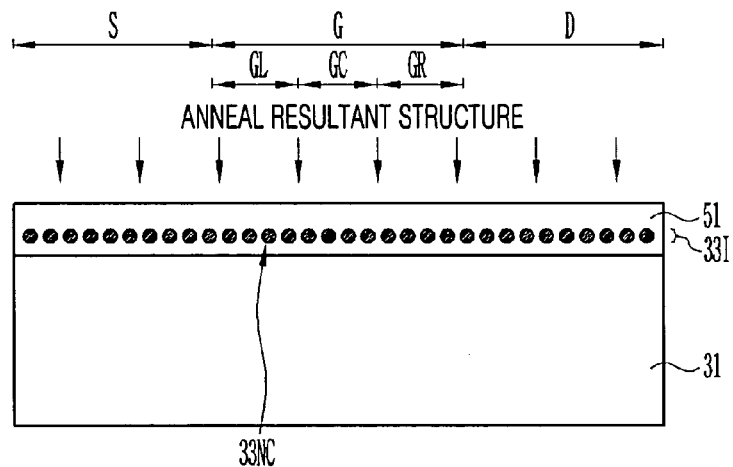

Referring to FIG. 5B, the metal or semiconductor ions of the ion implantation region 33I are crystallized using crystallization annealing, thereby forming a plurality of nano-crystals 33NC. For example, if the nano-crystals 33NC are formed of Si or Ge, the crystallization annealing is performed in an $N_2$ atmosphere at 950° C. for 30 minutes. If the nano-crystals 33NC are formed of other semiconductor or metal than Si or Ge, the crystallization annealing is performed under conditions of gaseous atmosphere, temperature, and time appropriate for the material. The nano-crystals 33NC have the form of clusters or dots having a size of several to several tens of nm, for example, about 1 to 15 nm. Also, a space between the nano-crystals 33NC is several to several tens of nm, for example, 1 to 10 nm, preferably, 5 to 10 nm. The size and space of the nano-crystals 33NC can be adjusted by controlling the conditions of the ion implantation process or the crystallization annealing.

Figure 5C:
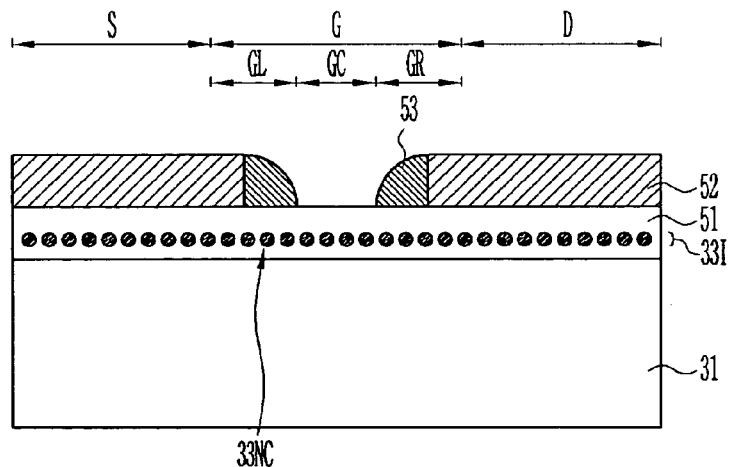

Referring to FIG. 5C, an etch preventing pattern 52 is formed on the first oxide layer 51 in which the nano-crystals 33NC are embedded, while exposing the gate section G. Also, etch preventing spacers 53 are formed on the sidewalls of the etch preventing pattern 52. Thus, a window that exposes a portion of the first oxide layer 51 formed in the charge isolation section GC is formed by the etch preventing pattern 52 and the etch preventing spacers 53. The etch preventing pattern 52 and the etch preventing spacers 53 are formed of a material having a high etch selectivity with respect to oxide, for example, polysilicon or nitride. The window is a space where the charge isolation layer 33C shown in FIG. 3 is formed through subsequent etch process and oxide layer filling process. This window should be formed to a length of about 10 to 100 nm. A conventional exposure apparatus fails to obtain the 10 to 100-nm window. Accordingly, to form the 10 to 100 nm window, the etch preventing pattern 52 is first formed using a conventional exposure apparatus, and then the etch preventing spacers 53 are formed on the sidewalls of the etch preventing pattern 52 by controlling the thickness.

Figure 5D:
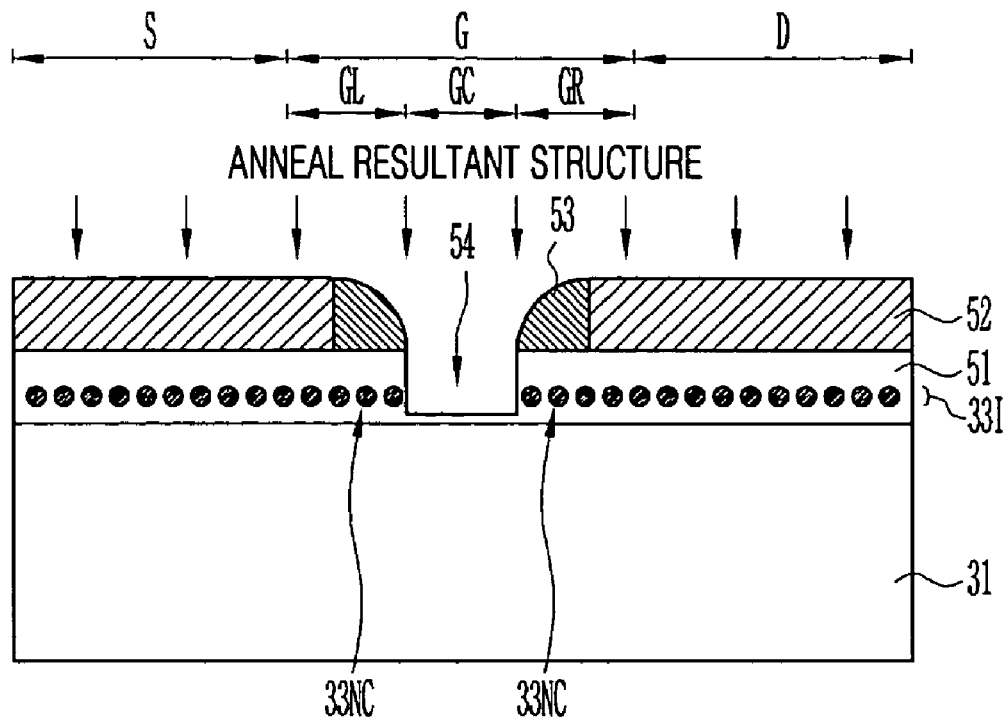

Referring to FIG. 5D, the first oxide layer 51 is etched using the etch preventing pattern 52 and the etch preventing spacers 53 as an etch mask, thereby forming a hole 54. During this etching process, an etch target is preferably set such that the nano-crystals 33NC embedded in the first oxide layer 51 are removed but the semiconductor substrate 31 is not exposed. If the etch preventing pattern 52 and the etch preventing spacers 53 are removed later while the semiconductor substrate 31 is being exposed, the semiconductor substrate 31 gets etch damage so that the electrical characteristics of the NVSM may be degraded.

Figure 5E:
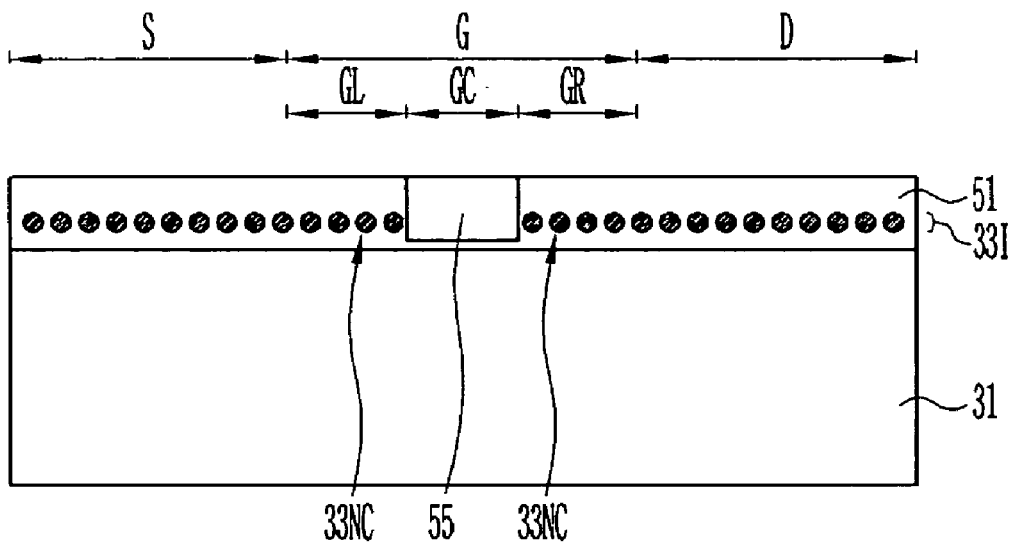

Referring to FIG. 5E, the etch preventing pattern 52 and the etch preventing spacers 53 are removed, and then a second oxide layer 55 is filled in the hole 54. The filling of the second oxide layer 55 may be performed using the following two methods. First, an oxide layer is deposited on the first oxide layer 51 including the hole 54, planarized using chemical mechanical polishing (CMP) or the like, and then cleaned such that the second oxide layer 55 is filled in the hole 54. In this method, even if the first oxide layer 51 was initially formed thinner or thicker than a desired thickness (i.e., about 5 to 170 nm), the final thickness of the first oxide layer 51 can reach the desired thickness by the planarization and cleaning processes. Second, an oxide layer is grown using thermal oxidation so that the second oxide layer 55 is filled in the hole 54. During the thermal oxidation, oxide is grown slowly on the first oxide layer 51, while oxide is grown rapidly on the semiconductor substrate 31 disposed on the bottom surface of the hole 54.

Figure 5F:
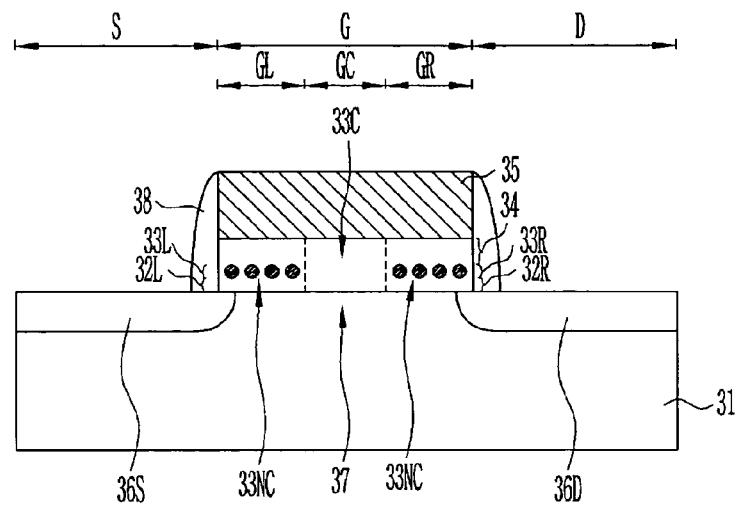

Referring to FIG. 5F, a gate electrode material is deposited on the first oxide layer 52 in which the nano-crystals 33NC are embedded and the second oxide layer 51 filled in the hole 54. Next, the gate electrode material and the first oxide layer 51 are etched using a gate mask (not shown) covering the gate section G as an etch mask, thereby forming a gate electrode 35. Then, a source region 36S and a drain region 36D are formed by implanting ions into the source and drain sections S and D, respectively, and insulating spacers 38 are formed. As a result, the NVSM shown in FIG. 3 is completed.

In the second embodiment, the first and second tunnel oxide layers 32L and 32R are divided from the blocking oxide layer 34 by the nano-crystals 33NC embedded in the first oxide layer 51. Thus, each of the first and second tunnel oxide layers 32L and 32R is about 1 to 5 nm thick, and the blocking oxide layer 34 is about 3 to 150 nm thick. The first charge trapping layer 33L includes nano-crystals 33NC embedded in a portion of the first oxide layer 51 formed in the first charge trapping section GL, while the second charge trapping layer 33R includes nano-crystals embedded in a portion of the first oxide layer 51 formed in the second charge trapping section GR. As a result of the gate etching process, each of the first and second charge trapping layers 33L and 33R becomes about 15 to 100 nm thick. The charge isolation layer 33C corresponds to a region of the second oxide layer 55 where no nano-crystals 33NC exists, and has a length of 10 to 100 nm. A distance between the source and drain regions 36S and 36D disposed on both sides of the gate electrode 35 is several tens to several hundreds of nm and thus, the channel region 37 also scales several tens to several hundreds of nm.

FIGS. 6A through 6E are cross-sectional views illustrating a method of manufacturing the NVSM shown in FIG. 3 according to a third embodiment of the present invention.

Figure 6A:
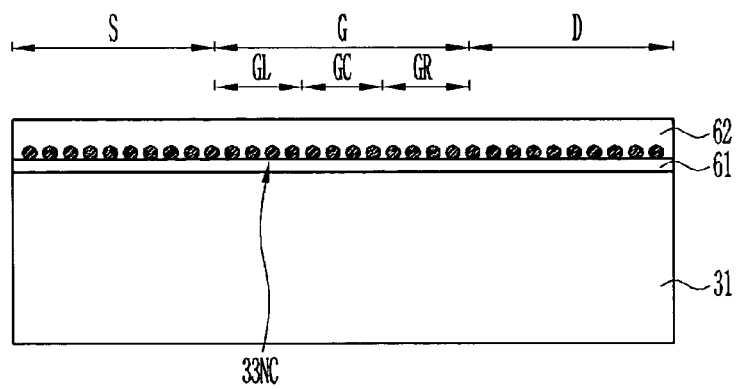
FIGS. 6A through 6E are cross-sectional views illustrating a method of manufacturing the NVSM shown in FIG. 3 according to a third embodiment of the present invention.

Referring to FIG. 6A, an isolation layer (not shown) is formed in a semiconductor substrate 31 using an ordinary isolation technique, thereby defining an active region. The active region of the semiconductor substrate 31 is divided into a source section S, a gate section G, and a drain section D, and the gate section G includes a first charge trapping section GL, a charge isolation section GC, and a second charge trapping section GR. The first charge trapping section GL is connected to the source section S, the second charge trapping section GR is connected to the drain section D, and the charge isolation section GC is interposed between the first and second charge trapping sections GL and GR. A first oxide layer 61 is formed on the semiconductor substrate 31. The first oxide layer 61 functions as the tunnel oxide layers 32L and 32R shown in FIG. 3 and is formed using thermal oxidation to a thickness of about 1 to 5 nm. A plurality of nano-crystals 33NC are formed on the first oxide layer 61 by performing deposition using a CVD apparatus. The nano-crystals 33NC are formed of a metal or a semiconductor in the form of clusters or dots having a size of several to several tens of nm, for example, about 1 to 15 nm. A space between the nano-crystals 33NC is several to several tens of nm, for example, about 1 to 10 nm, preferably, 5 to 10 nm. The size and space of the nano-crystals 33NC can be adjusted by controlling conditions under which the CVD process is performed. A second oxide layer 62 is formed on the first oxide layer 61 on which the nano-crystals 33NC are formed. The second oxide layer 62 functions as the blocking oxide layer 34 shown in FIG. 3 and is formed using an ordinary oxidation process to a thickness of about 3 to 150 nm. However, the second oxide layer 62 may be formed thicker or thinner than a desired thickness at this moment since its thickness can be controlled during subsequent processes.

Figure 6B:
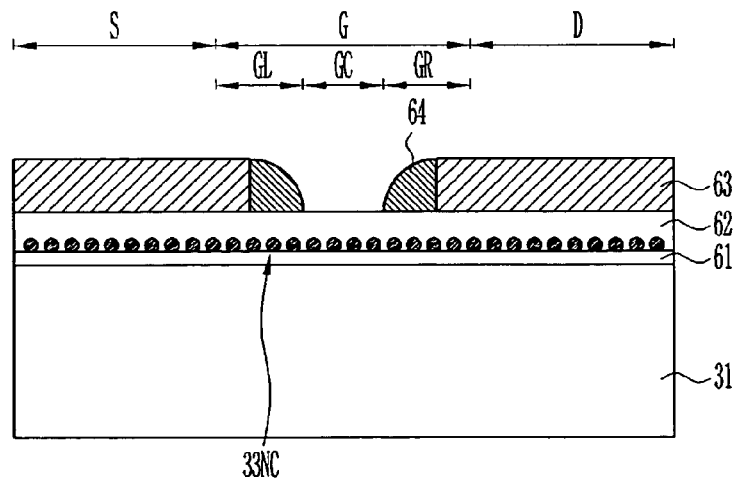

Referring to FIG. 6B, an etch preventing pattern 63 is formed on the second oxide layer 62 in which the nano-crystals 33NC are embedded, such that the gate section G is exposed. Then, etch preventing spacers 64 are formed on the sidewalls of the etch preventing pattern 63. Thus, a window that exposes a portion of the second oxide layer 62 formed in the charge isolation section GC is formed by the etch preventing pattern 63 and the etch preventing spacers 64. The etch preventing pattern 63 and the etch preventing spacers 64 are formed of a material having a high etch selectivity with respect to oxide, for example, polysilicon or nitride.

The window is a space where the charge isolation layer 33C shown in FIG. 3 is formed using subsequent etching process and oxide filling process. The window is formed to a length of about 10 to 100 nm.

A process of forming the window is as follows.

Specifically, the etch preventing pattern 63 is first formed using an exposure apparatus, and then the etch preventing spacers 64 are formed on the sidewalls of the etch preventing pattern 63 by controlling the thickness, such that the window has a length of about 10 to 100 nm.

Figure 6C:
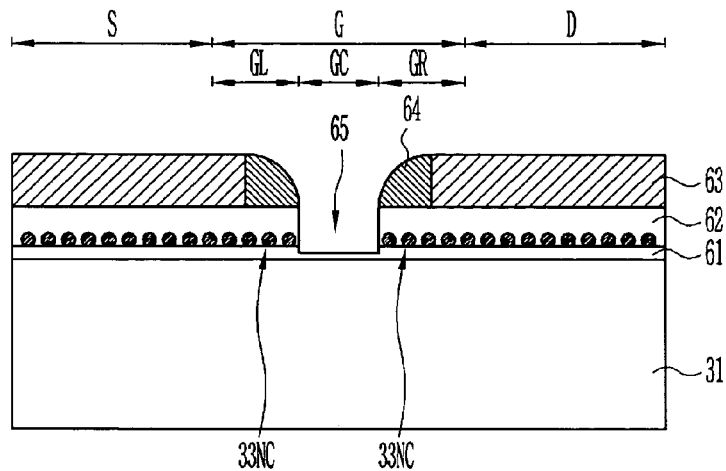

Referring to FIG. 6C, the first and second oxide layers 61 and 62 are etched using the etch preventing pattern 63 and the etch preventing spacers 64 as an etch mask, thereby forming a hole 65. During the etching process, an etch target is set such that the nano-crystals 33NC embedded in the second oxide layer 62 are removed but the semiconductor substrate 31 is not exposed due to the remaining first oxide layer 61. If the etch preventing pattern 62 and the etch preventing spacers 63 are removed later while the semiconductor substrate 31 is being exposed, the semiconductor substrate 31 gets etch damage so that the electrical characteristics of the NVSM may be degraded.

Figure 6D:
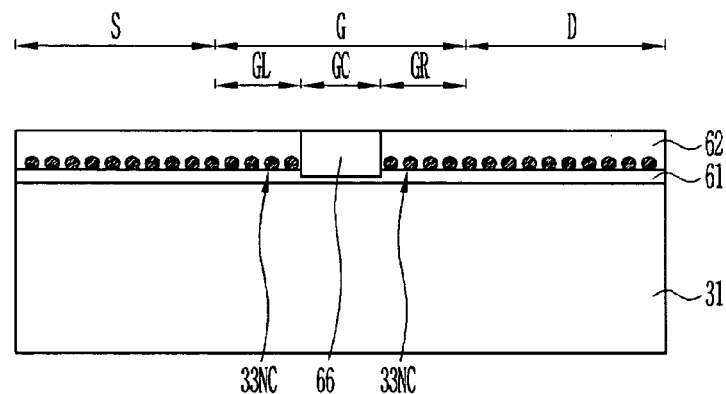

Referring to FIG. 6D, the etch preventing pattern 63 and the etch preventing spacers 64 are removed, and then a third oxide layer 66 is filled in the hole 65. The filling of the third oxide layer 66 may be performed using the following two methods. First, an oxide layer is deposited on the second oxide layer 62 including the hole 65, planarized using CMP or the like, and then cleaned such that the third oxide layer 66 is filled in the hole 65. In this method, even if the second oxide layer 62 was initially formed thinner or thicker than a desired thickness (i.e., about 5 to 170 nm), the final thickness of the second oxide layer 62 can reach the desired thickness by the planarization and cleaning processes. Second, an oxide layer is grown using thermal oxidation so that the third oxide layer 66 is filled in the hole 65. During the thermal oxidation, oxide is grown slowly on the second oxide layer 62, while oxide is grown rapidly on the semiconductor substrate 31 disposed on the bottom surface of the hole 65.

Figure 6E:
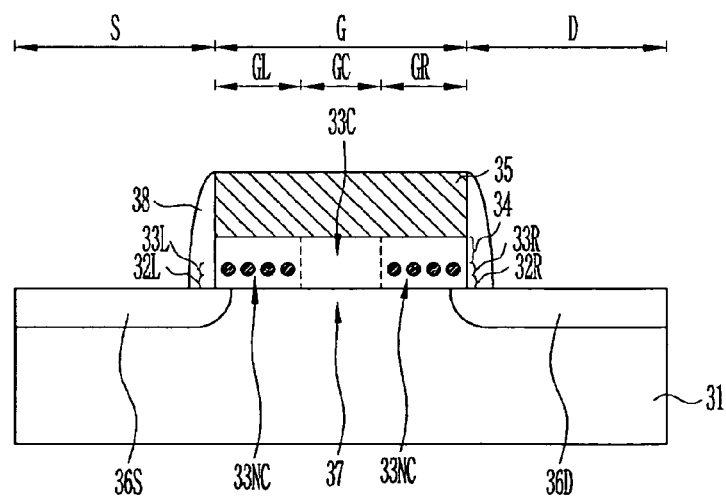

Referring to FIG. 6E, a gate electrode material is deposited on the second oxide layer 62 in which the nano-crystals 33NC are embedded and the third oxide layer 66 filled in the hole 65. Next, the gate electrode material and the first and second oxide layers 61 and 62 are etched using a gate mask (not shown) covering the gate section G as an etch mask, thereby forming a gate electrode 35. Then, a source region 36S and a drain region 36D are formed by implanting ions into the source and drain sections S and D, respectively, and insulating spacers 38 are formed. As a result, the NVSM shown in FIG. 3 is completed.

In the third embodiment, during the gate etching process, the first oxide layer 61 functions as the first and second tunnel oxide layers 32L and 32R shown in FIG. 3, and the second oxide layer 62 functions as the blocking oxide layer 34 shown in FIG. 3. The first charge trapping layer 33L includes nano-crystals 33NC embedded in a portion of the second oxide layer 62 formed in the first charge trapping section GL, while the second charge trapping layer 33R includes nano-crystals embedded in a portion of the second oxide layer 62 formed in the second charge trapping section GR. As a result of the gate etching process, each of the first and second charge trapping layers 33L and 33R becomes about 15 to 100 nm thick. The charge isolation layer 33C corresponds to a region of the third oxide layer 66 where no nano-crystals 33NC exists, and has a length of 10 to 100 nm. A distance between the source and drain regions 36S and 36D disposed on both sides of the gate electrode 35 is several tens to several hundreds of nm and thus, the channel region 37 also scales several tens to several hundreds of nm.

FIGS. 7A through 7F are cross-sectional views illustrating a method of manufacturing the NVSM shown in FIG. 3 according to a fourth embodiment of the present invention.

Figure 7A:
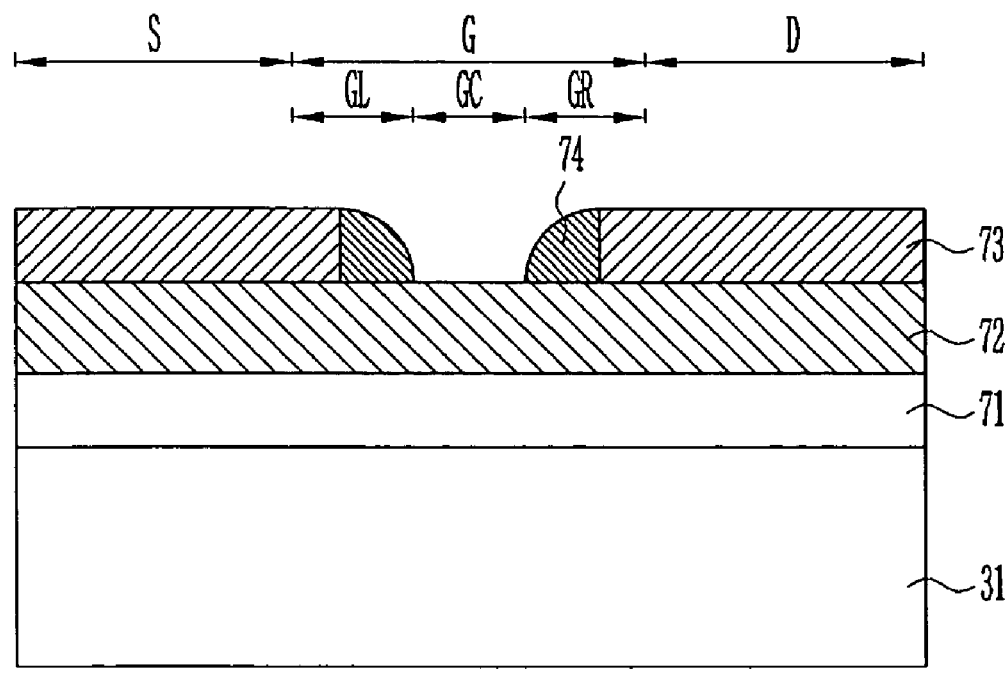
FIGS. 7A through 7E are cross-sectional views illustrating a method of manufacturing the NVSM shown in FIG. 3 according to a fourth embodiment of the present invention.

Referring to FIG. 7A, an isolation layer (not shown) is formed in a semiconductor substrate 31 using an ordinary isolation technique, thereby defining an active region. The active region of the semiconductor substrate 31 is divided into a source section S, a gate section G, and a drain section D according to design rules, and the gate section G includes a first charge trapping section GL, a charge isolation section GC, and a second charge trapping section GR. The first charge trapping section GL is connected to the source section S, the second charge trapping section GR is connected to the drain section D, and the charge isolation section GC is interposed between the first and second charge trapping sections GL and GR. A first oxide layer 71 is formed on the semiconductor substrate 31. The first oxide layer 71 is formed to a thickness equivalent to the sum of the thickness of a tunnel oxide layer, the size of nano-crystals forming a charge trapping layer, and the thickness of a blocking oxide layer, which will be defined later. Thus, the first oxide layer 71 is formed to a thickness of about 5 to 90 nm using an ordinary oxidation process. The range of about 5 to 90 nm is obtained from a minimum and a maximum of the sum of thicknesses of the respective elements as described with reference to FIG. 3. A doped polysilicon layer 72 for a gate electrode is formed on the first oxide layer 71. An oxidation preventing pattern 73 is formed on the doped polysilicon layer 72 such that the gate section G is exposed, and oxidation preventing spacers 74 are formed on the sidewalls of the oxidation preventing pattern 73. By the oxidation preventing pattern 73 and the oxidation preventing spacers 74, a window that exposes a portion of the doped polysilicon layer 72 formed in the charge isolation section GC is formed. The oxidation preventing pattern 73 and the oxidation preventing spacers 74 are formed of nitride. The window is a space where the charge isolation layer 33C shown in FIG. 3 will be formed and should be formed to a length of about 10 to 100 nm. A conventional exposure apparatus fails to obtain the 10 to 100 nm window. Accordingly, to form the 10 to 100 nm window, the oxidation preventing pattern 73 is first formed using a conventional exposure apparatus, and then the oxidation preventing spacers 74 are formed on the sidewalls of the etch preventing pattern 74 by controlling the thickness.

Figure 7B:
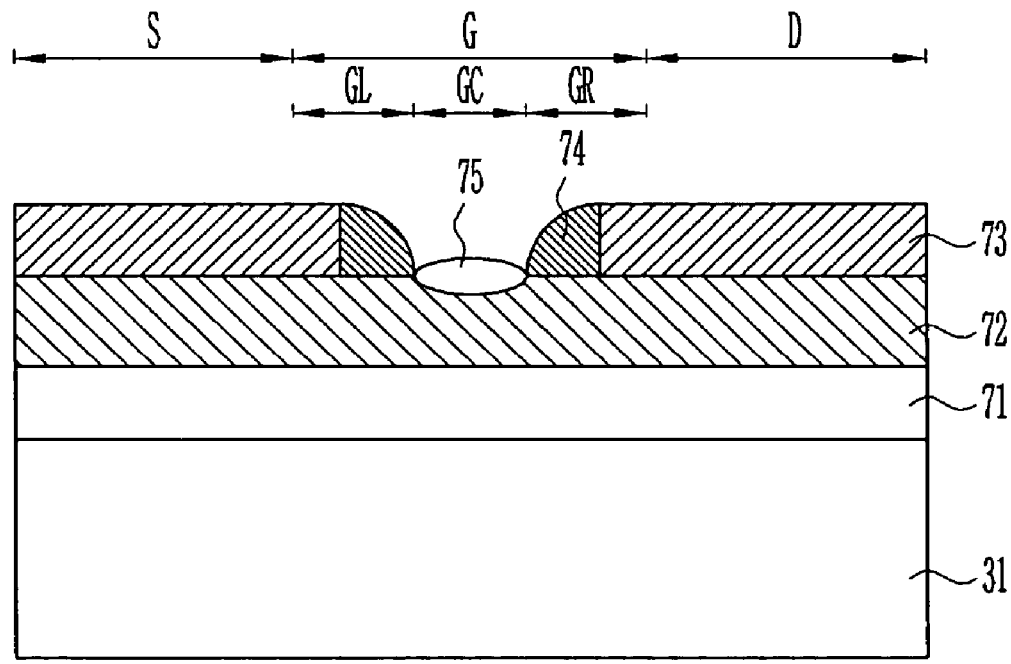

Referring to FIG. 7B, by performing an oxidation process using the oxidation preventing pattern 73 and the oxidation preventing spacers 74, a second oxide layer 75 is formed on the exposed polysilicon layer 72.

Figure 7C:
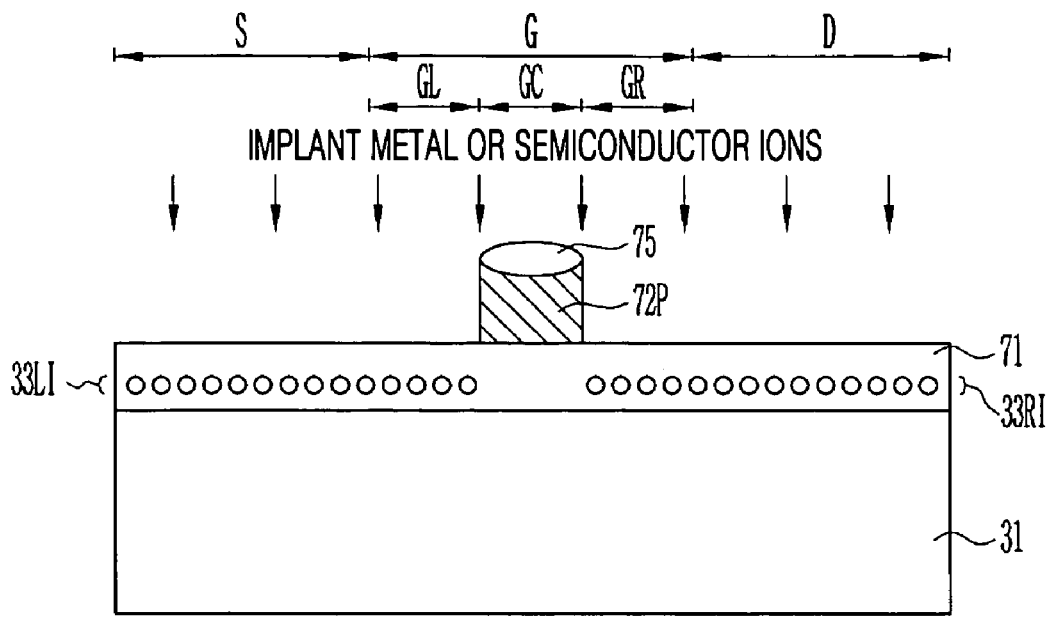

Referring to FIG. 7C, the oxidation preventing pattern 73 and the oxidation preventing spacers 74 are removed. Thereafter, the doped polysilicon layer 72 is etched using the second oxide layer 75 as an etch mask, thereby forming a polysilicon pattern 72P. Thus, the polysilicon pattern 72 remains only in the charge isolation section GC to a linewidth of 10 to 100 nm, which a conventional exposure apparatus fails to obtain, and the first oxide layer 71 is exposed around the polysilicon pattern 72P. By using the second oxide layer 75 and the polysilicon pattern 72P as an ion implantation mask, metal ions or semiconductor ions are implanted into the first oxide layer 71. As a result, a first ion implantation region 33LI is formed in the first oxide layer 71 formed in the first charge trapping section GL and the source section S. Also, a second ion implantation region 33RI is formed in the first oxide layer 71 formed in the second charge trapping section GR and the drain section D.

The first and second ion implantation region 33LI and 33RI are important elements that determine the thickness of a tunnel oxide layer that will be defined later. Thus, since the ion implantation process is performed at an appropriate energy considering that the thickness of each of the first and second tunnel oxide layers 32L and 32R shown in FIG. 3 is 1 to 5 nm, the first and second ion implantation regions 33LI and 33RI can be formed about 1 to 5 nm apart from the semiconductor substrate 31.

Figure 7D:
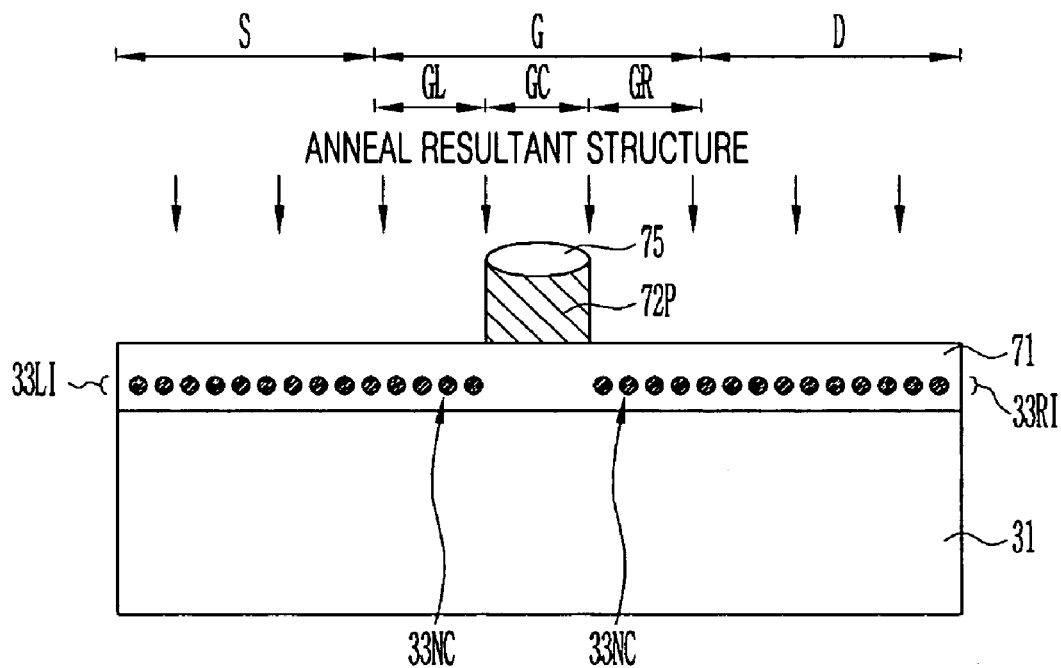

Referring to FIG. 7D, the metal ions or semiconductor ions implanted into the first and second ion implantation regions 33LI and 33RI are crystallized using crystallization annealing, thereby forming a plurality of nano-crystals 33NC. For example, if the nano-crystals 33NC are formed of Si or Ge, the crystallization annealing is performed in an $N_2$ atmosphere at 950° C. for 30 minutes. If the nano-crystals 33NC are formed of other semiconductor or metal than Si or Ge, the crystallization annealing is performed under conditions of gaseous atmosphere, temperature, and time appropriate for the material. The nano-crystals 33NC have the form of clusters or dots having a size of several to several tens of nm, for example, 1 to 15 nm. Also, a space between the nano-crystals 33NC is several to several tens of nm, for example, 1 to 10 nm, preferably, 5 to 10 nm. The size and space of the nano-crystals 33NC can be adjusted by controlling the conditions of the ion implantation process or the crystallization annealing.

Figure 7E:
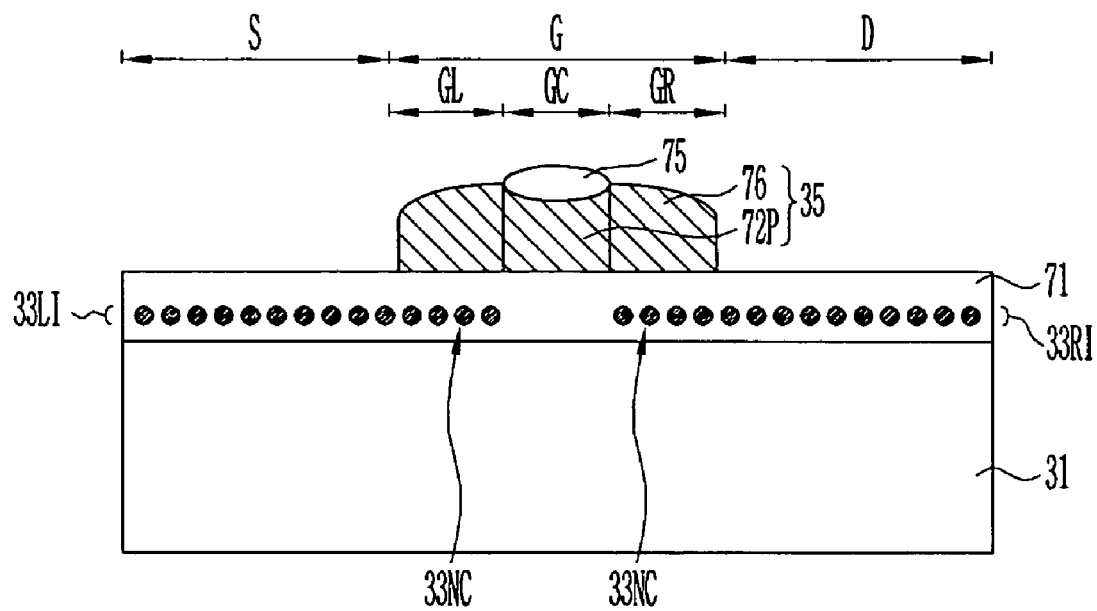

Referring to FIG. 7E, a doped polysilicon layer for a gate electrode is formed on the entire structure including the first oxide layer 71 in which the nano-crystals 33NC are embedded, and polysilicon layer spacers 76 are formed on the both sidewalls of the polysilicon pattern 72P using a spacer etching process. Thus, a gate electrode 35, which is formed of the polysilicon pattern 72P and the polysilicon layer spacers 76, is formed. The polysilicon layer spacers 76 are important elements that determine the length of a charge trapping layer that will be defined later. Thus, since the deposition thickness of the polysilicon layer and the spacer etching process are controlled considering that the length of each of the first and second charge trapping layers 33L and 33R is about 15 to 100 nm, the polysilicon layer spacers 76 can be appropriately formed.

Figure 7F:
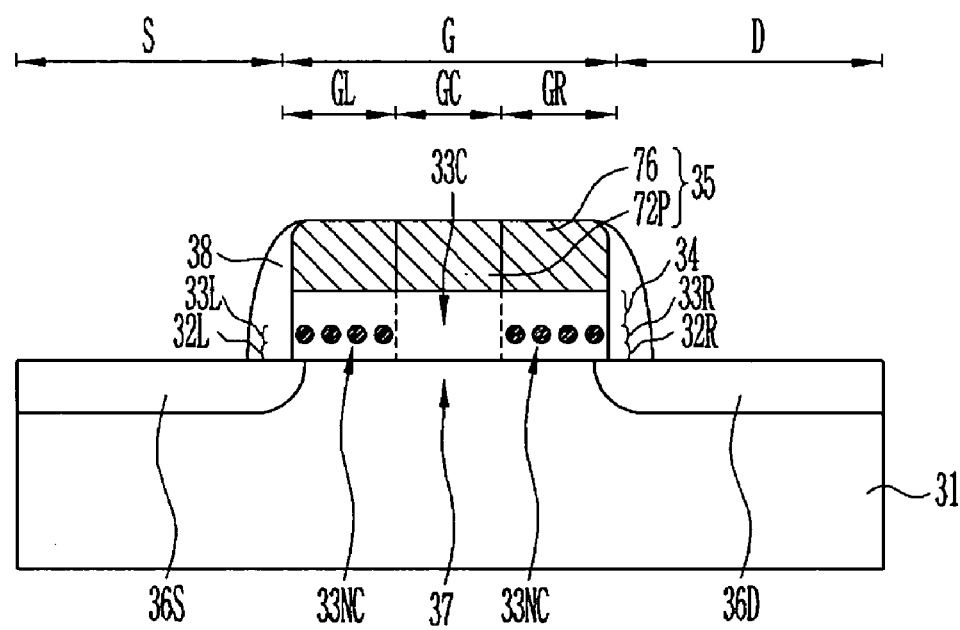

Referring to FIG. 7F, the second oxide layer 75 formed on the polysilicon pattern 72P and the first oxide layer 71 exposed around the polysilicon layer spacers 76 are removed using an oxide etching process, thereby completing the gate electrode 35. Thereafter, a source region 36S and a drain region 36D are formed by implanting ions into the source and drain sections S and D, respectively, and insulating spacers 38 are formed. As a result, the NVSM shown in FIG. 3 can be obtained. Meanwhile, in order to reduce sheet resistance, the gate electrode 35 may have a polycide structure, in which polysilicon and metal-silicide are stacked using a salicide process using a metal such as Ti or Co.

In the fourth embodiment, the first and second tunnel oxide layers 32L and 32R are divided from the blocking oxide layer 34 by the nano-crystals 33NC embedded in the first oxide layer 71. Thus, each of the first and second tunnel oxide layers 32L and 32R is about 1 to 5 nm thick, and the blocking oxide layer 34 is about 3 to 150 nm thick. The first charge trapping layer 33L includes nano-crystals 33NC embedded in a portion of the first oxide layer 71 formed in the first charge trapping section GL, while the second charge trapping layer 33R includes nano-crystals embedded in a portion of the first oxide layer 71 formed in the second charge trapping section GR. As a result of the gate etching process, each of the first and second charge trapping layers 33L and 33R becomes about 15 to 100 nm thick. The charge isolation layer 33C corresponds to a region of the first oxide layer 71 where no nano-crystals 33NC exist, and has a length of 10 to 100 nm due to the polysilicon pattern 72P. A distance between the source and drain regions 36S and 36D disposed on both sides of the gate electrode 35 is several tens to several hundreds of nm and thus, the channel region 37 also scales several tens to several hundreds of nm.

As described above, the NVSM of the present invention includes the tunnel oxide layer, the charge trapping layers including the plurality of nano-crystals, and the blocking oxide layer, which are stacked between the channel region and the gate electrode. In this NVSM, the first and second charge trapping layers are separated from each other by the charge isolation layer and formed near the source and drain regions, respectively. As a result, no lateral diffusion occurs between charges injected into the first charge trapping layer near the source region and charges injected into the second charge trapping layer near the drain region, thus resulting in no disturbance. Accordingly, the NVSM of the present invention can be reduced to a nanoscale size or less, and the further downscaling of conventional 2-bit-per-cell NVSMs is enabled. Also, the NVSM of the present invention can meet the requisitions of the next-generation semiconductor technologies, such as low voltage, subminiature size, ultra-high integration, high performance, and high reliability.

Moreover, since the NVSM of the present invention can be manufactured using a conventional CMOS process, it can be mass-produced not only as stand-alone products but also embedded products.

While the present invention has been particularly shown and described with reference to preferred embodiments thereof, it should be appreciated that the scope of the invention is not limited to the detailed description of the invention hereinabove, which is intended merely to be illustrative, but rather defined by the subject matter disclosed in the following claims.

What is claimed is:

1. A nonvolatile memory device comprising:
    a semiconductor substrate;
    a source region and a drain region disposed in the semiconductor substrate and a channel region interposed between the source and drain regions;
    a first tunnel oxide layer disposed on the channel region near the source region;
    a second tunnel oxide layer disposed on the channel region near the drain region;
    a first charge trapping layer disposed on the first tunnel oxide layer;
    a second charge trapping layer disposed on the second tunnel oxide layer;
    a blocking oxide layer covering the first and second charge trapping layers;
    a charge isolation layer interposed between the first and second charge trapping layers; and
    a gate electrode disposed on the blocking oxide layer.

2. The device of claim 1, wherein each of the first and second tunnel oxide layers is about 1 to 5 nm thick.

3. The device of claim 1, wherein each of the first and second charge trapping layers is about 15 to 100 nm in length.

4. The device of claim 1, wherein each of the first and second charge trapping layers includes a plurality of nano-crystals having the form of clusters or dots.

5. The device of claim 1, wherein the first and second charge trapping layers are formed of at least one selected from the group consisting of tungsten, molybdenum, cobalt, nickel, platinum, rhodium, palladium, and iridium, or a mixture or alloy thereof.

6. The device of claim 1, wherein the first and second charge trapping layers are formed of one selected from the group consisting of silicon, germanium, a mixture of silicon and germanium, III–V group compounds, and II–VI group compounds.

7. The device of claim 1, wherein the charge isolation layer is about 10 to 100 nm in length.

8. The device of claim 1, wherein the blocking oxide layer is about 3 to 150 nm thick.

* * * * *